United States Patent [19]

Downey

[11] Patent Number: 6,087,247
[45] Date of Patent: Jul. 11, 2000

[54] METHOD FOR FORMING SHALLOW JUNCTIONS IN SEMICONDUCTOR WAFERS USING CONTROLLED, LOW LEVEL OXYGEN AMBIENTS DURING ANNEALING

[75] Inventor: Daniel F. Downey, Magnolia, Mass.

[73] Assignee: Varian Semiconductor Equipment Associates, Inc., Gloucester, Mass.

[21] Appl. No.: 09/015,640

[22] Filed: Jan. 29, 1998

[51] Int. Cl.[7] ............................................. H01L 21/477
[52] U.S. Cl. ........................ 438/530; 438/795; 438/514
[58] Field of Search ................................. 438/514, 515, 438/530, 795, 909, 920

[56] References Cited

U.S. PATENT DOCUMENTS

| | | | |
|---|---|---|---|
| 4,625,450 | 12/1986 | Tani et al. | 438/430 |
| 5,279,973 | 1/1994 | Suizu | 438/430 |

OTHER PUBLICATIONS

M. I. Current, et al, "20 da eV (200eV) to 10 keV Boron Implantation and Rapid Thermal Annealing of Si(100); A SiMS and TEM Study", 4th Intl. Workshop–Meas., Char.&Modeling of Ultra–Shallow Doping Profiles, Apr. 1997, pp. 41.4 to 41.12.

E. J. H. Collart et al, "Char. of Low Energy (100 eV–10 keV) Boron Ion Implantation", 4th Intl. Workshop–Meas. Char. & Modeling of Ultra–Shallow Doping Profiles, Apr. 1997, pp. 6.1 to 6.9.

A. Agarwal et al, "Boron Enhanced Diffusion of Boron: The Limiting Factor for Ultra–Shallow Junctions", IEDM 97, 1997, pp. 467–470.

Daniel F. Downey et al, "Rapid Thermal Process Req. for the Annealing of Ultra–Shallow Junctions", Varian Assoc., Inc., Report No. 298, Mat. Research Soc. Symp., Apr. 1997.

S. S. Todorov et al, "Optimization of RTP Annealing of Low–Energy $BF_2$ and Boron Implants", Proc. of RTP '97 5th Int'l. Conf. on Advanced Thermal Processing of Semiconductors, Sep. 1997.

S. D. Marcus et al, "Rapid Thermal Annealing of Low Energy As Implants", Proc. of RTP '97, 5th Int'l. Conf. on Advanced Thermal Processing of Semiconductors, Sep. 1997.

C. W. Magee et al, "Analytical Techniques to Detect Boron Dopant Loss in Ultra–Shallow Junctions as a Function of Post Doping Processing", Proc. of 4th Int'l. Workshop on Ultra–Shallow Junctions, Apr. 1997, p. 8.1.

*Primary Examiner*—Savitri Mulpuri
*Attorney, Agent, or Firm*—Wolf, Greenfield & Sacks, P.C.

[57] ABSTRACT

A method is provided for forming a shallow junction in a semiconductor wafer that has been implanted with a dopant material. The dopant material is activated by thermal processing of the semiconductor wafer in a thermal processing chamber at a selected temperature for a selected time. The oxygen concentration in the thermal processing chamber during activation of the dopant material is controlled at or near a selected level less than a background level that is typically present when the thermal processing chamber is filled with a process gas. The oxygen concentration may be controlled at or near a selected level in a range less than 1000 parts per million and is preferably controlled at or near a selected level in a range of about 30–300 parts per million. The method is particularly useful for implanted boron or $BF_2$ ions, but may be used for any dopant material.

10 Claims, 13 Drawing Sheets

METHOD FOR FORMING SHALLOW JUNCTIONS IN SEMICONDUCTOR WAFERS USING CONTROLLED, LOW LEVEL OXYGEN AMBIENTS DURING ANNEALING

FIELD OF THE INVENTION

This invention relates to methods for forming shallow junctions in semiconductor wafers by ion implantation of a dopant material followed by thermal processing of the semiconductor wafer to activate the dopant material and, more particularly, to methods for retarding diffusion of dopant materials during thermal processing by controlling oxygen concentration in the thermal processing chamber.

BACKGROUND OF THE INVENTION

Ion implantation is a standard technique for introducing conductivity-altering dopant materials into semiconductor wafers. In a conventional ion implantation system, a desired dopant material is ionized in an ion source, the ions are accelerated to form an ion beam of prescribed energy, and the ion beam is directed at the surface of the wafer. The energetic ions in the beam penetrate into the bulk of the semiconductor material and are embedded into the crystalline lattice of the semiconductor material. Following ion implantation, the semiconductor wafer is annealed to activate the dopant material. Annealing involves heating the semiconductor wafer to a prescribed temperature for a prescribed time.

A well-known trend in the semiconductor industry is toward smaller, higher speed devices. In particular, both the lateral dimensions and the depths of features in semiconductor devices are decreasing. State of the art semiconductor devices require junction depths less than 1000 angstroms and may eventually require junction depths on the order of 200 angstroms or less.

The implanted depth of the dopant material is determined by the energy of the ions implanted into the semiconductor wafer. Shallow junctions are obtained with low implant energies. However, the annealing process that is used for activation of the implanted dopant material causes the dopant material to diffuse from the implanted region of the semiconductor wafer. As a result of such diffusion, junction depths are increased by annealing. To counteract the increase in junction depth produced by annealing, the implant energy may be decreased, so that a desired junction depth after annealing is obtained. This approach provides satisfactory results, except in the case of very shallow junctions. A limit is reached as to the junction depth that can be obtained by decreasing implant energy, due to the diffusion of the dopant material that occurs during annealing. In addition, ion implanters typically operate inefficiently at very low implant energies.

Rapid thermal processing can be used to minimize the diffusion that occurs during annealing. However, significant changes to the annealing process, such as reduced annealing temperatures, would reduce the amount of dopant material activated and would thereby adversely affect the operating characteristics of the semiconductor device.

The current state of the art for low energy boron implants, which are annealed at a typical temperature of 1050° C. for good electrical activation, provides junction depths in excess of 1050 angstroms. Prior art attempts to reduce the junction depth for low energy boron have met with limited success. The process of transient enhanced diffusion (TED), wherein silicon interstitial enhance diffusion of boron, has been proposed to explain the difficulty in achieving ultra shallow junctions. See, for example, M. I. Current et al, "20 da eV (200 eV) to 10 keV Boron Implantation and Rapid Thermal Annealing of Si(100): A SIMS and TEM Study", 4th International Workshop-Meas., Char. & Modeling of Ultra-Shallow Doping Profiles, April 1997, pages 41.1 to 41.12 and E.J. H. Collart et al "Characterization of Low Energy (100 eV10 keV) Boron Ion Implantation", 4th International Workshop-Meas., Char. & Modeling of Ultra-Shallow Doping Profiles, April 1997, pages 6.1 to 6.9.

It was reported by A. Agarwal et al in "Boron Enhanced Diffusion of Boron: The Limiting Factor for Ultra-Shallow Junctions", IEDM 97, 1997, pages 467–470, that boron enhanced diffusion (BED) is a limiting factor for creating shallow junctions with boron implants at energies below 1 keV annealed at 1050° C. for 10 seconds. It was reported that no matter how low in energy the boron was implanted, and even for a 1 eV molecular beam epitaxy deposition, a junction depth greater than 1000 angstroms resulted. Boron enhanced diffusion was reported to be caused by the formation of a $SiB_4$ layer which injects interstitials into the silicon and drives this enhanced diffusion. This boron enhanced diffusion was reported to be the limiting factor in fabricating boron shallow junctions.

None of the prior art known to applicant has provided a satisfactory process for fabricating ultra shallow junctions of selected junction depth and sheet resistance, particularly where the required junction depth cannot be obtained simply by reducing the implant energy. Accordingly, a need exists for improved methods for fabricating ultra-shallow junctions in semiconductor wafers and for improved methods for activating implanted dopant material in semiconductor wafers by thermal processing.

SUMMARY OF THE INVENTION

According to a first aspect of the invention, a method for forming a shallow junction in a semiconductor wafer is provided. The method comprises the steps of implanting a dopant material into the semiconductor wafer, activating the dopant material by thermal processing of the semiconductor wafer in a thermal processing chamber at a selected temperature for a selected time and controlling oxygen concentration in the thermal processing chamber during the step of activating the dopant material. The oxygen concentration is controlled at or near a selected level less than a background level that is typically present when the thermal processing chamber is filled with a process gas.

The oxygen concentration in the thermal processing chamber is preferably controlled at or near a selected level in a range of about 30 to 300 parts per million for semiconductor wafers implanted with $B^+$ or $BF_2^+$ ions. More preferably, the oxygen concentration is controlled at or near a selected level in a range of about 30–40 parts per million.

The oxygen concentration may be controlled by reducing the oxygen concentration below the desired level by purging or vacuum pumping and then introducing a controlled amount of oxygen to achieve the selected oxygen concentration level. In another approach, the thermal processing chamber may be backfilled with a process gas containing oxygen at or near the selected oxygen concentration level. The selected oxygen concentration level may be established and controlled using any suitable gas control techniques.

The process of the invention may be advantageously be used in connection with low energy boron implants to produce junction depths less than 1000 angstroms.

According to another aspect of the invention, a method for forming a shallow junction in a semiconductor wafer is provided. The method comprises the steps of implanting a dopant material into the semiconductor wafer, activating the dopant material by thermal processing of the semiconductor wafer in a thermal processing chamber at a selected temperature for a selected time and controlling oxygen concentration in the thermal processing chamber during the step of activating the dopant material. The oxygen concentration in the thermal processing chamber is controlled at or near a selected level less than 1000 parts per million.

According to a further aspect of the invention, a method for activating an implanted dopant material in a semiconductor wafer is provided. The semiconductor wafer is annealed in a thermal processing chamber at a selected temperature for a selected time. Oxygen concentration in the thermal processing chamber is controlled during annealing at or near a selected level less than a background level that is typically present when the thermal processing chamber is filled with a process gas.

According to another aspect of the invention, a method for thermal processing of a semiconductor wafer is provided. A semiconductor wafer having implanted dopant material is placed in a thermal processing chamber. The oxygen concentration in the thermal processing chamber is reduced to a level at or near zero. Then, oxygen is introduced into the thermal processing chamber at or near a selected concentration level that is less than a background level that is typically present when the thermal processing chamber is filled with a process gas. The dopant material is activated by thermal processing of the semiconductor wafer in the thermal processing chamber at a selected temperature for a selected time with the oxygen concentration in the thermal processing chamber controlled at or near the selected concentration level.

The process of the present invention overcomes previously reported limitations on the depths of boron shallow junctions, providing much shallower junctions at 1 keV and even shallower junctions as the energy is further decreased. It has been found that boron enhanced diffusion is not a limiting factor that prevents the fabrication of shallow junctions with low energy implants.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
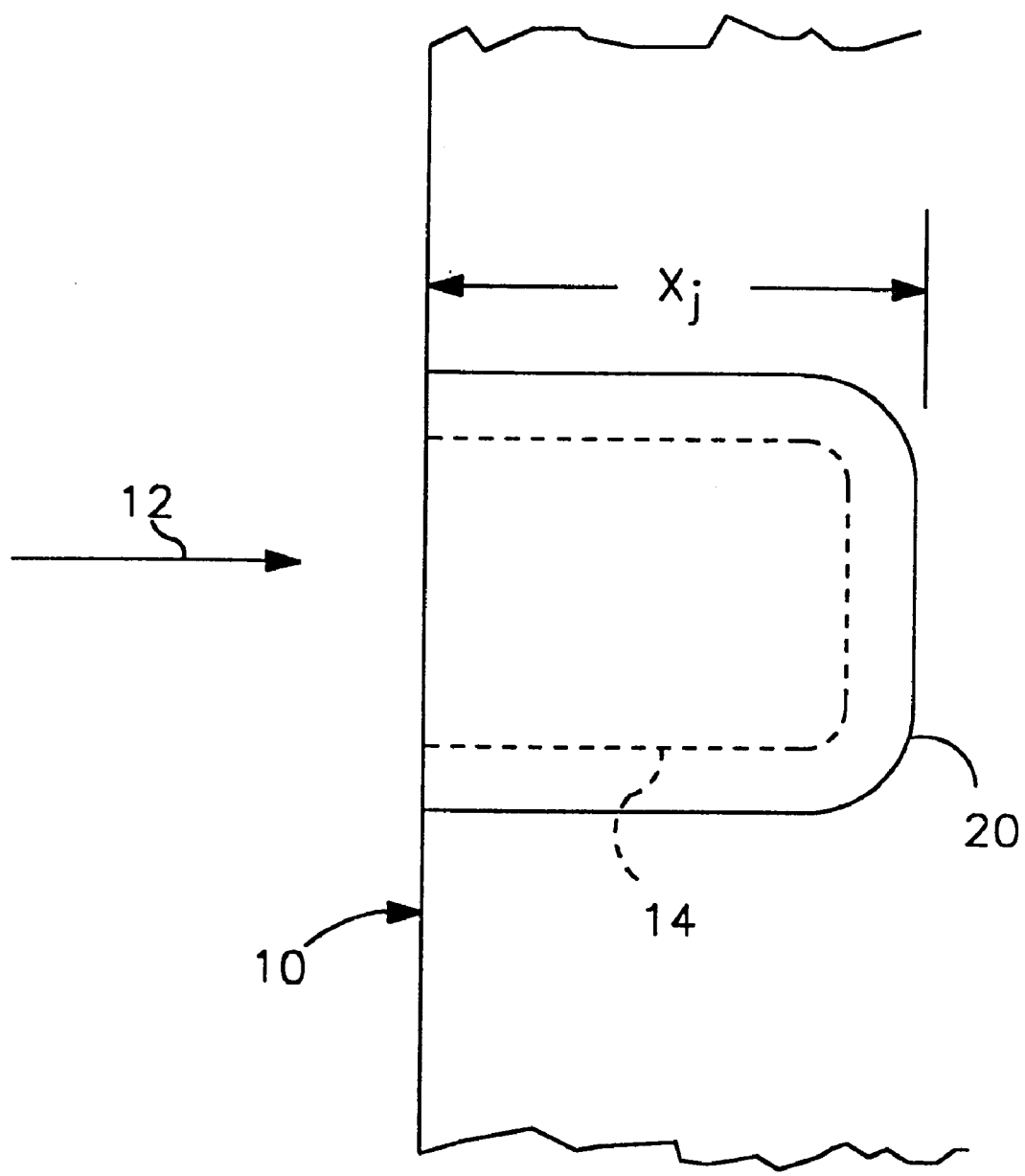
FIG. 1 is a simplified, partial cross-sectional view of a semiconductor wafer.

A simplified, partial cross-sectional view of a semiconductor wafer 10 is shown in FIG. 1. As known in the art, impurity regions may be formed in the semiconductor wafer by ion implantation. An ion beam 12 of a dopant material is directed at wafer 10, producing an implanted region 14. The wafer 10 is then annealed, typically in a rapid thermal processor, to activate the dopant material. The annealing process causes diffusion of the dopant material to an impurity region 20 that is larger than the implanted region 14. The impurity region 20 is characterized by a junction depth $X_j$ which is the depth of the impurity region 20 normal to the surface of wafer 10. The junction depth depends, in part, on the energy of ion beam 12 and the parameters of the annealing process. The increase in junction depth that occurs during annealing is limited in accordance with the present invention.

According to the present invention, the oxygen concentration in the thermal processing chamber is controlled during annealing at or near a selected level less than the background level that is typically present when the thermal processing chamber is filled with a process gas according to prior art techniques in which oxygen concentrations were uncontrolled. This background level is typically 1000 parts per million or greater and is uncontrolled. According to the invention, the oxygen concentration is preferably controlled at or near a selected level less than 1000 parts per million and more preferably is controlled at or near a selected level in a range of about 30 to 300 parts per million. The invention is particularly useful for forming ultra shallow junctions when the dopant material is boron or boron difluoride (BF$_2$) and the required junction depth is less than about 1000 angstroms. However, the invention is not limited to this application and may be applied to activation of other dopant materials, including but not limited to arsenic and phosphorous.

Figure 2:
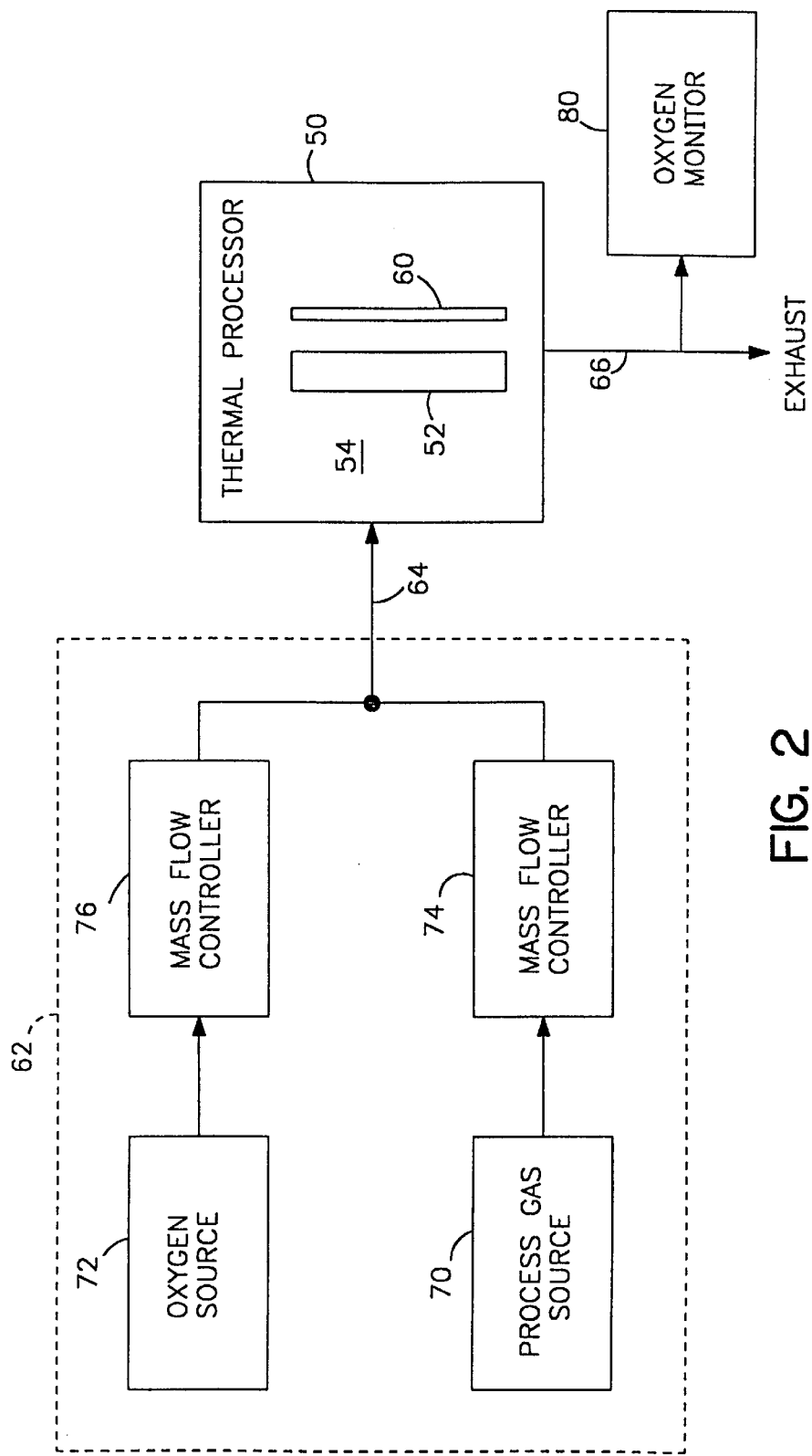
FIG. 2 is a block diagram of an example of a thermal processing system in accordance with the present invention.

A block diagram of an example of a system for thermal processing of semiconductor wafers in accordance with the invention is shown in FIG. 2. A thermal processor 50 includes a heater 52 mounted in a thermal processing chamber 54. A semiconductor wafer 60 is positioned in proximity to heater 52 for thermal processing at a selected temperature for a selected time. An example of a suitable thermal processor 50 is a rapid thermal processor, such as the Model SH 2800e, manufactured by STEAG AST elektroniks. However, different rapid thermal processors and conventional thermal processing ovens may be utilized within the scope of the present invention.

The thermal processing chamber 54 receives a process gas from a gas control system 62 through an inlet port 64. The process gas leaves thermal processing chamber 54 through an exhaust port 66. The gas control system 62 may include a process gas source 70 and an oxygen source 72. The process gas source 70 is typically a nitrogen source but may supply any other suitable process gas, including but not limited to argon and ammonia. The gas source 70 supplies gas through a mass flow controller 74 to the inlet port 64 of thermal processor 50. Oxygen source 72 supplies oxygen through a mass flow controller 76 to the inlet port 64 of thermal processor 54. By appropriate adjustment of the mass flow controllers 74 and 76, the relative concentrations of oxygen and process gas supplied to the thermal processing chamber may be controlled. An oxygen monitor 80 is connected to output port 66 to measure the oxygen concentration in thermal processing chamber 54. In one example, the mass flow controllers 74 and 76 may each be a Bronkhorst Hi-Tec F2000 series.

Figure 3:
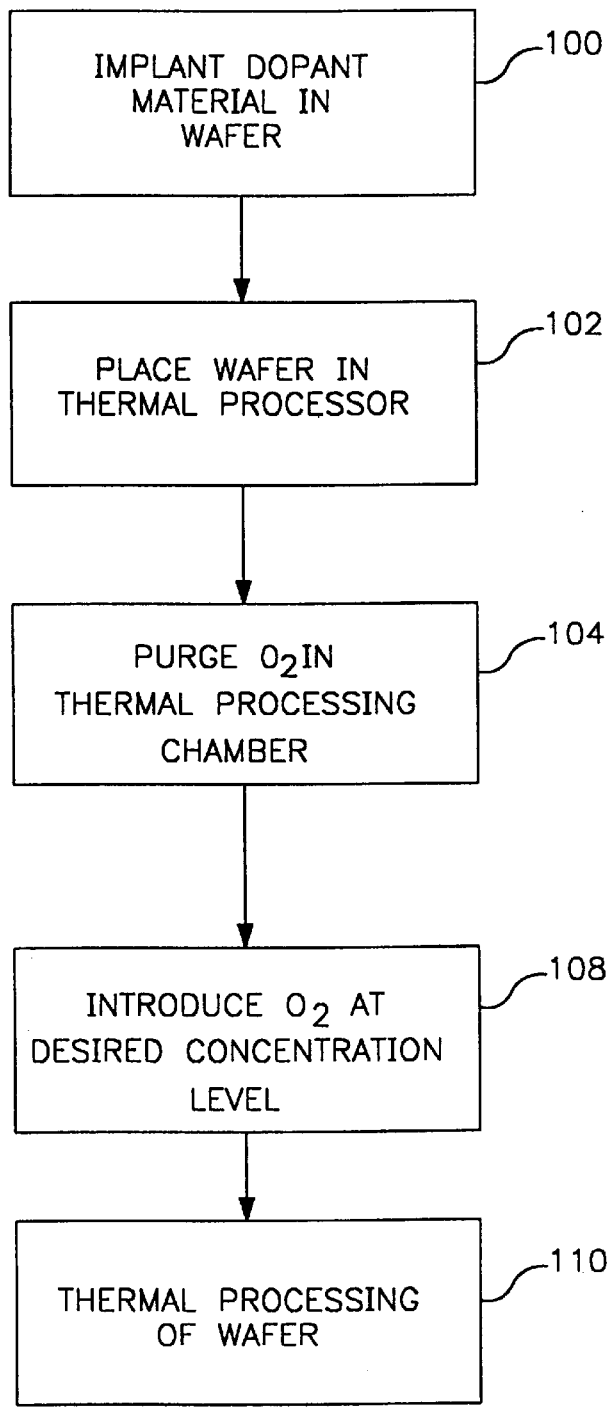
FIG. 3 is a flow chart showing an example of a method for forming shallow junctions in accordance with the invention.

A flow diagram of the process steps associated with the present invention is shown in FIG. 3. In step 100, a dopant material is implanted into a semiconductor wafer. The species, dose and energy of the dopant material are selected to produce an impurity region of a desired depth and conductivity in the semiconductor wafer. As indicated above, the dopant material may be boron, $BF_2$, arsenic, phosphorous or any other desired dopant material. The invention is particularly advantageous in connection with boron and $BF_2$ implantation. The implant energy is typically less than 10 keV and may be less than 2 keV to achieve ultra shallow junctions. The process of the invention is particularly useful for boron implants of 2 keV and lower and provides more pronounced results at implant energies below 2 keV. By way of example, the dopant material may be implanted using the Model VIIS ion 80 PLUS, manufactured and sold by Varian Associates, Inc.

In step 102, the wafer is placed in a thermal processor, such as the thermal processor 50 shown in FIG. 2 and described above. In step 104, thermal processing chamber 54 is purged of oxygen. This may be accomplished by flowing gas from process gas source 70 through thermal processing chamber 54 with the mass flow controller 76 connected to oxygen source 72 shut off. Typically, nitrogen is used as the process gas. When oxygen monitor 80 indicates an oxygen concentration in thermal processing chamber 54 at or near zero part per million, oxygen is introduced into the thermal processing chamber 54 (step 108) at or near a selected concentration level by appropriately adjusting mass flow controller 76. As indicated above, the selected oxygen concentration level is less than a background level that is typically present when the thermal processing chamber is filled with a processing gas. Preferred oxygen concentration levels are discussed in more detail below.

When the selected oxygen concentration, as indicated by oxygen monitor 80, is reached, thermal processing of wafer 60 may proceed in step 110. The wafer is processed for a selected time at a selected temperature. The anneal time and temperature depend on the desired characteristics of the semiconductor device being fabricated. Typical annealing processes utilize temperatures in a range of about 950° C. to 1050° C. and times of about 30 seconds or less, but are not limited to these ranges. Annealing processes may include a variety of different temperature ramp rates, cool down rates, temperatures and times within the scope of the present invention. Furthermore, so-called "spike anneals", wherein a very short duration temperature transient is applied to the wafer, are included within the scope of the invention.

It has been determined that the background level of oxygen present during prior art anneal processes is typically 1000 parts per million or greater and may be as high as 10%. Furthermore, the oxygen concentration in prior art processes is uncontrolled. It has further been determined that the presence of uncontrolled oxygen is detrimental to the creation of shallow and repeatable junctions, particularly for boron implants. Controlling oxygen concentration has been found to provide repeatability and reduced junction depths in comparison with prior art anneal processes. It is believed that transient enhanced diffusion and recently-defined boron enhanced diffusion are in fact largely oxygen enhanced diffusion (OED) or oxygen enhanced TED and BED. The results reported here indicate that controlling oxygen concentrations at very low levels in the thermal processing chamber permits ultra shallow junctions to be fabricated.

Controlling oxygen concentration at or near a selected level less than 1000 parts per million permits repeatable ultra shallow junctions to be fabricated. The selected oxygen concentration level is a function of anneal temperature and time, thickness of pre-anneal oxides or capping layers, and dose, energy and species of the implant. Oxygen concentrations at or near zero minimize the enhanced diffusion but can cause etching of the wafer surface and/or evaporation of dopant material from the wafer surface. The oxygen concentration for boron and $BF_2$ implants is preferably controlled at or near a selected level in a range of about 30–300 parts per million and more preferably is controlled at or near a selected level in a range of about 30–40 parts per million. Furthermore, the oxygen concentration may be controlled at or near the selected level or within a range of concentrations, depending on the application.

Control of oxygen concentration has been described above in connection with the gas control system 62 (FIG. 2) which includes process gas source 70, oxygen source 72 and mass flow controllers 74 and 76. In general, any suitable gas control system may be utilized for establishing and controlling oxygen concentration within the thermal processing chamber. For example, the thermal processing chamber may be vacuum pumped and then backfilled with a process gas having the selected oxygen concentration level.

Results of measurements are shown in FIGS. 4–13. In each case, a system as shown in FIG. 2 and described above was used.

Figure 4:
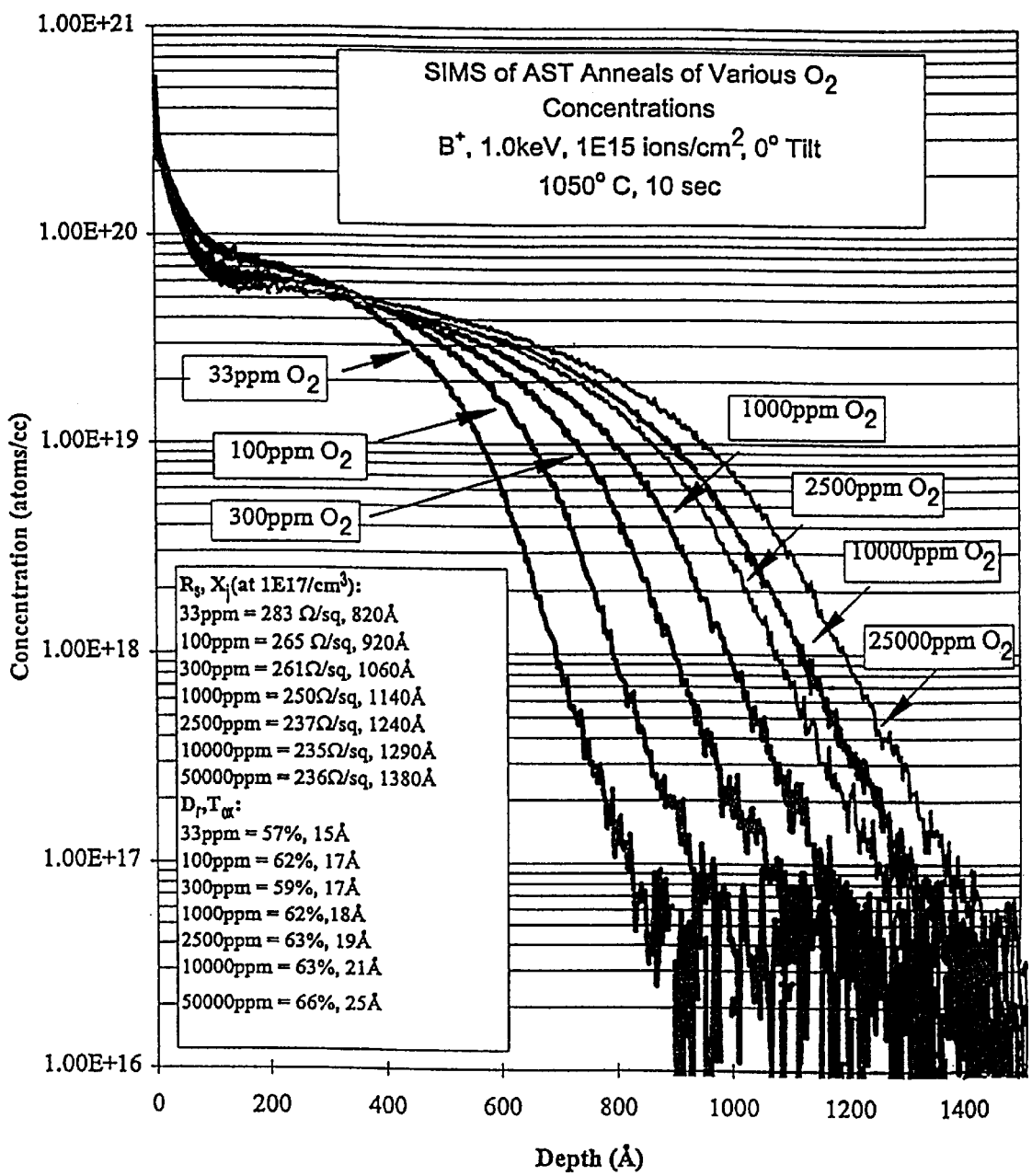
FIG. 4 is a graph of boron concentration as a function of depth in semiconductor wafers for different oxygen concentration levels used during thermal processing.

FIG. 4 shows concentration of boron atoms in atoms/cm$^3$ as function of depth in angstroms from a wafer surface, as measured by secondary ion mass spectroscopy (SIMS), for various oxygen concentrations. Boron ions were implanted at an energy of 1.0 keV and a dose of 1E15 ions/cm$^2$ (the notation 1E15 indicates an implant dose of $1 \times 10^{15}$ ions per square centimeter). The wafers were annealed at 1050° C. for 10 seconds. The following parameters are indicated on the graph for different oxygen concentrations: sheet resistivity $R_s$; junction depth $X_j$ measured at a concentration of 1E17/cm$^3$; retained dose $D_r$, and oxide thickness $T_{ox}$. As indicated, a wafer annealed at an oxygen concentration of 33 parts per million gave a junction depth of 820 angstroms and a sheet resistivity of 283 ohms per square.

The profile at 1000 parts per million oxygen represents the junction depth and sheet resistivity typically obtained in prior art processes, when no special precautions are taken to reduce the oxygen concentration. Note that as the oxygen concentration is reduced using the process of the present invention, the junction depth continuously decreases with oxygen concentration. From 1000 parts per million oxygen to 33 parts per million oxygen, the junction depth decreases a total of 320 angstroms.

Figure 5:
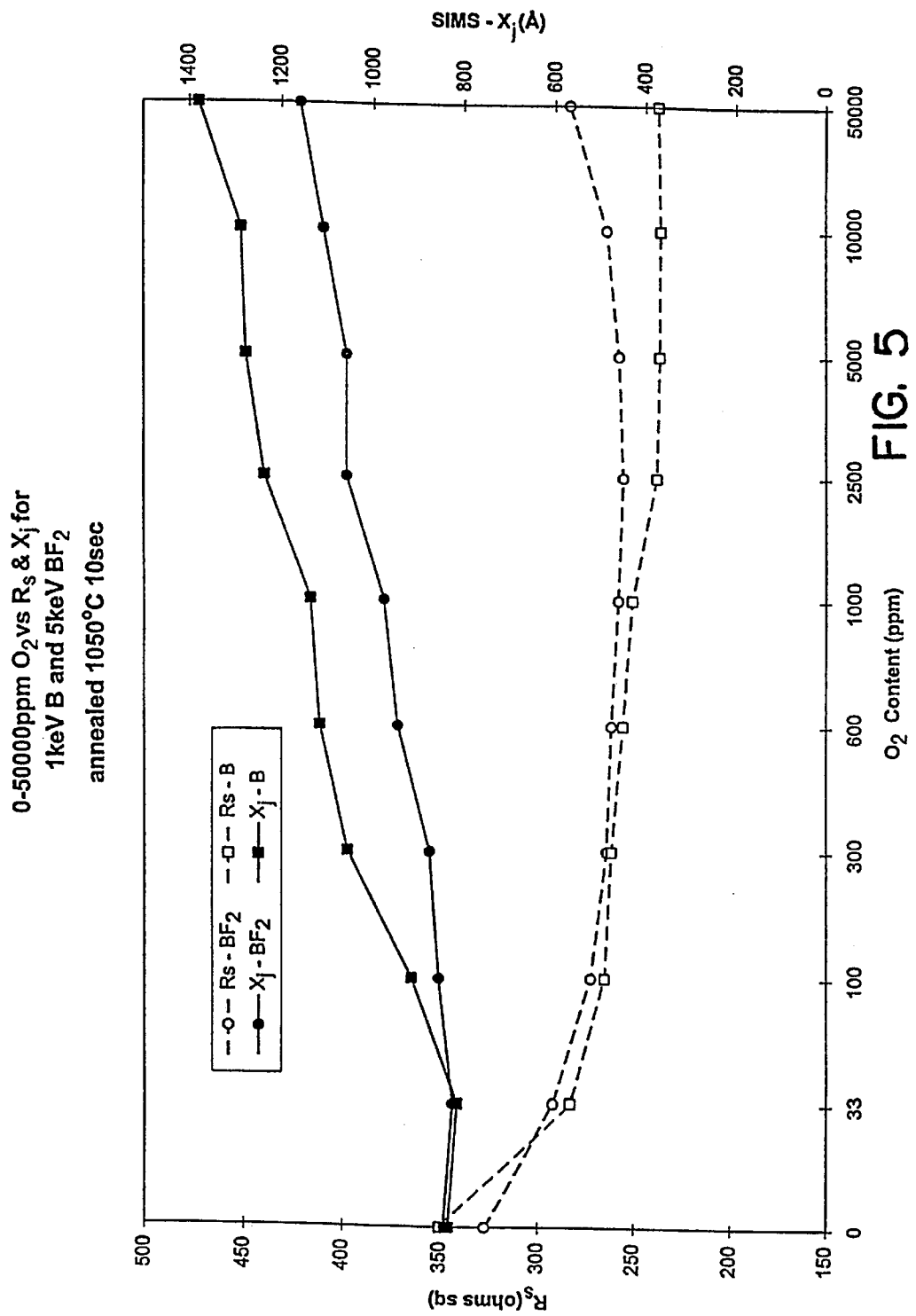
FIG. 5 is a graph of junction depth and sheet resistivity as a function of oxygen concentration for wafers implanted with 1 keV boron and 5 keV BF$_2$ and annealed at 1050° C. for 10 seconds.

FIG. 5 is a graph of junction depth $X_j$ in angstroms and sheet resistivity Rs in ohms per square as a function of oxygen concentration in parts per million for wafers implanted with 1 keV boron and 5 keV $BF_2$. The wafers were annealed at 1050° C. for 10 seconds. A minimum junction depth occurs at an oxygen concentration of approximately 33 parts per million.

FIG. 5 shows that the 1 keV boron implant at about 0 parts per million oxygen has not become any shallower, and that sheet resistivity has increased due to out-diffusion of dopant material, either from surface evaporation or etching of the silicon surface. There may be situations, such as when an oxide is left in place, or the dose and/or energy of the implant may be such that operating with an oxygen concentration level between 0 and 33 parts per million may be preferred.

In addition, FIG. 5 compares the "equivalent energy" $BF_2$ implant with the 1 keV boron implant. Both junction depths decrease with decreasing oxygen concentration to about 33 parts per million, with the $BF_2$ implant being shallower. At 33 parts per million oxygen, the junction depths become equivalent. Both exhibit an increase in sheet resistivity below 33 parts per million oxygen. For this example, one can conclude that 33 parts per million oxygen provides, for both cases, a good optimum point for the balance of shallow junction depth with minimal sheet resistivity.

Figure 6:
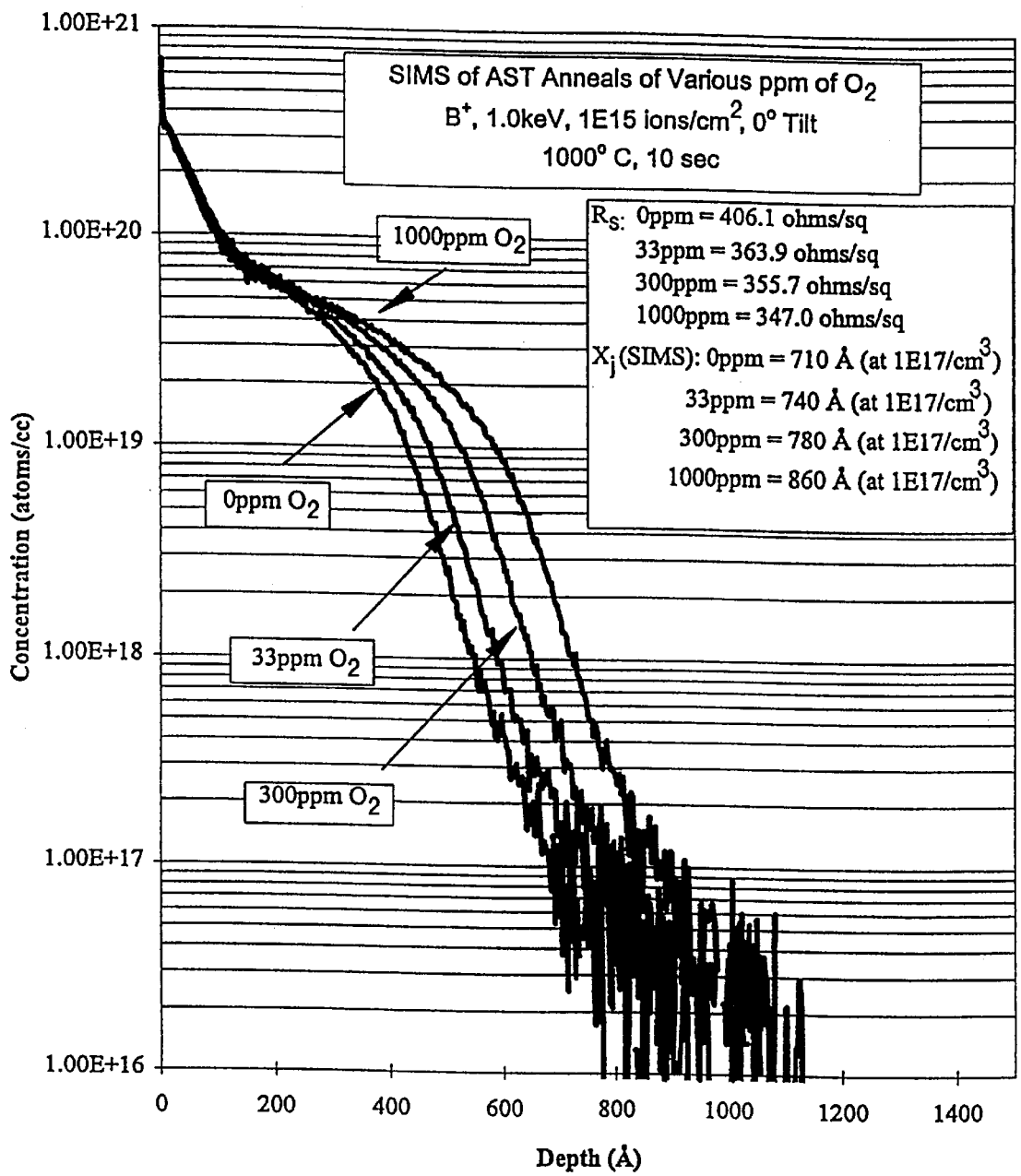
FIG. 6 is a graph of boron concentration as a function of depth in semiconductor wafers for different oxygen concentration levels used during thermal processing.

FIG. 6 is a graph of boron concentration in atoms/cm³ as a function of depth in angstroms for boron ions implanted at 1.0 keV and 1E15 ions/cm², for various oxygen concentrations. The wafers were annealed at 1000° C. for 10 seconds. The junction depths $X_j$ and sheet resistivity $R_s$ are indicated.

In FIG. 6, the 1000 parts per million oxygen profile is the typical profile from a prior art rapid thermal processor anneal. At 1000 parts per million oxygen, the junction depth is 860 angstroms, and the sheet resistivity is 347 ohms per square. The junction depth decreases to 710 angstroms at 0 parts per million oxygen. The sheet resistivity increases to 406 ohms per square at 0 parts per million. This is a result of surface evaporation of boron or etching of silicon The optimum choice of oxygen concentration level may be selected by the user depending on the objective. For this example (at 1000° C.), the optimum choice is most likely between 0 and 33 parts per million oxygen.

Figure 7:
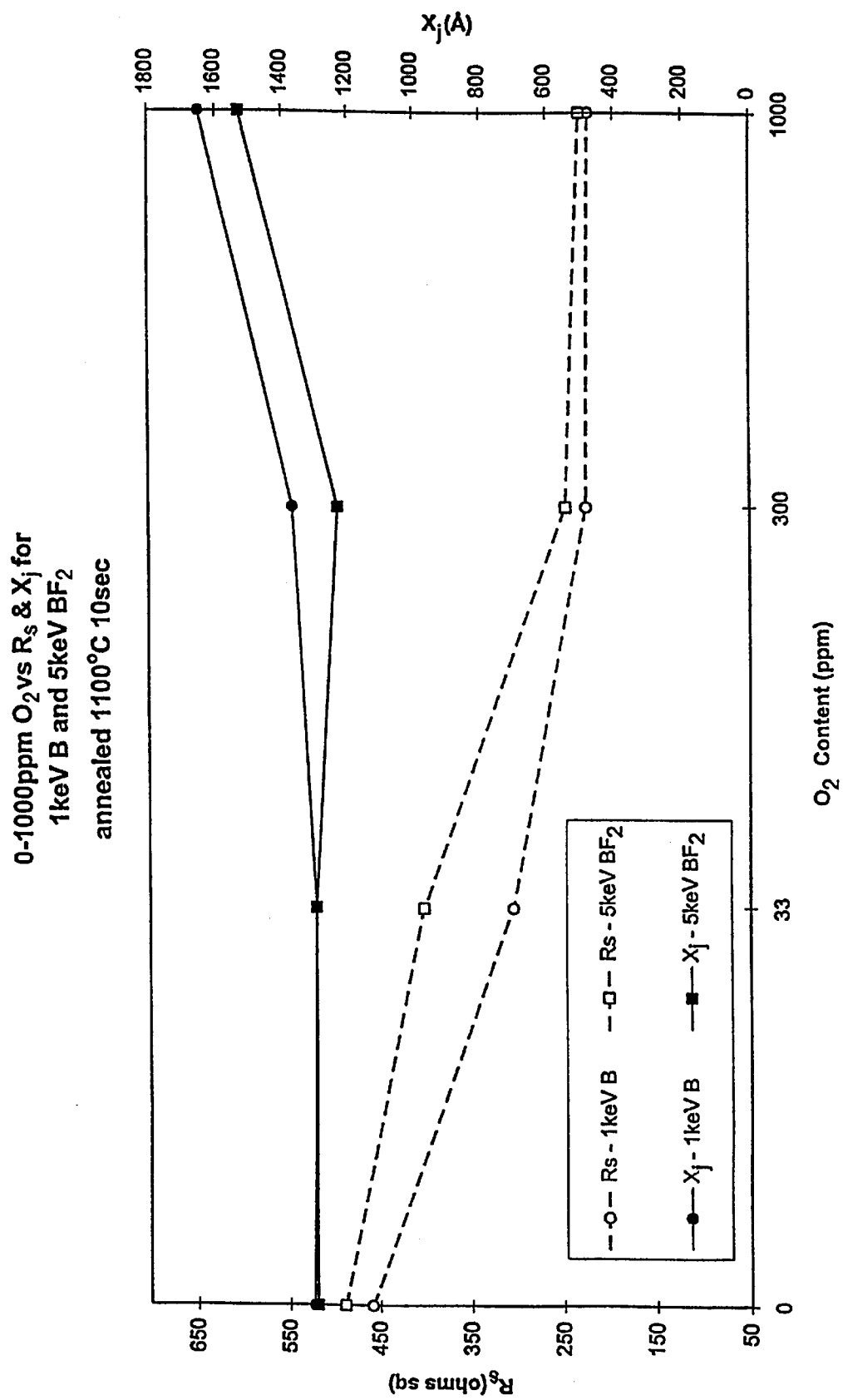
FIG. 7 is a graph of junction depth and sheet resistivity as a function of oxygen concentration for wafers implanted with 1 keV boron and 5 keV BF$_2$ and annealed at 1100° C. for 10 seconds.

FIG. 7 is a graph of junction depth $X_j$ in angstroms and sheet resistivity $R_s$ in ohms per square as a function of oxygen concentration in parts per million for wafers implanted with 1 keV boron and 5 keV $BF_2$. The wafers were annealed at 1100° C. for 10 seconds.

FIG. 7 shows that at higher temperature anneals, such as 1100° C., both boron and $BF_2$ at equivalent implant energies (approximately 1 keV boron) exhibit a decrease in junction depth to about 33 parts per million oxygen. The sheet resistivity, however, starts to increase at 300 parts per million oxygen. This shows the temperature dependency of the optimum oxygen concentration level. In particular, the optimum concentration at 1000° C. is between 0 and 33 parts per million; at 1050° C. is about 33 parts per million; and at 1100° C. is about 300 parts per million. The reason is that the out-diffusion evaporation rate of boron and the silicon etching increase with temperature. To offset that, an oxide layer, provided by oxygen, must be grown faster, and thus a higher oxygen concentration level is required.

Figure 8:
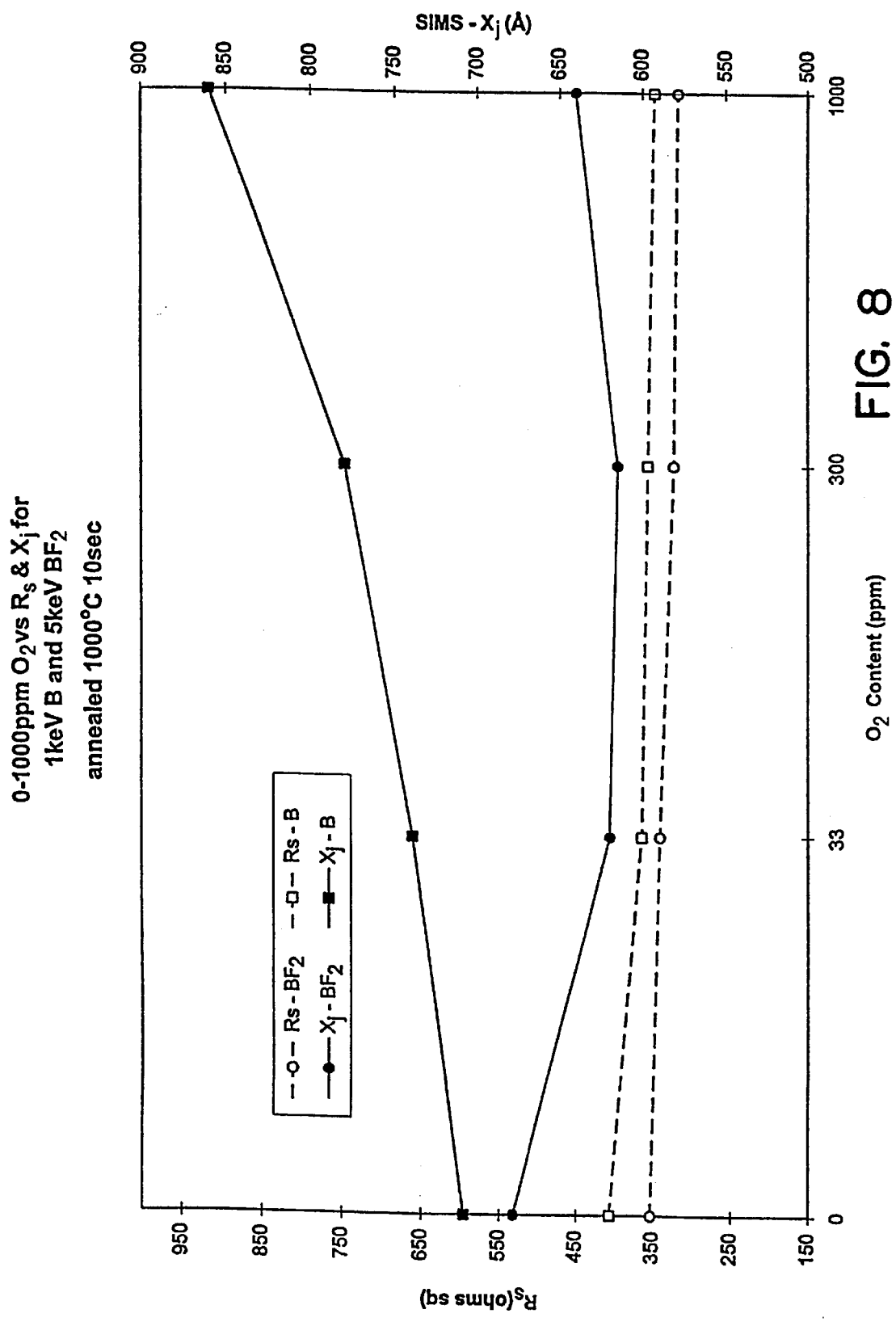
FIG. 8 is a graph of junction depth and sheet resistivity as a function of oxygen concentration for wafers implanted with 1 keV boron and 5 keV BF$_2$ and annealed at 1000° C. for 10 seconds.

FIG. 8 is a graph of junction depth $X_j$ in angstroms and sheet resistivity $R_s$ in ohms per square as a function of oxygen concentration in parts per million for wafers implanted with 1 keV boron and 5 keV $BF_2$. The wafers were annealed at 1000° C. for 10 seconds.

FIG. 8 shows the temperature effect for a 1000° C. anneal. Note that the boron junction depth continues to decrease down to 0 parts per million oxygen, and the sheet resistivity increases between 33 and 0 parts per million oxygen, but at a slower rate than at 1050° C. and 1100° C.

Figure 9:
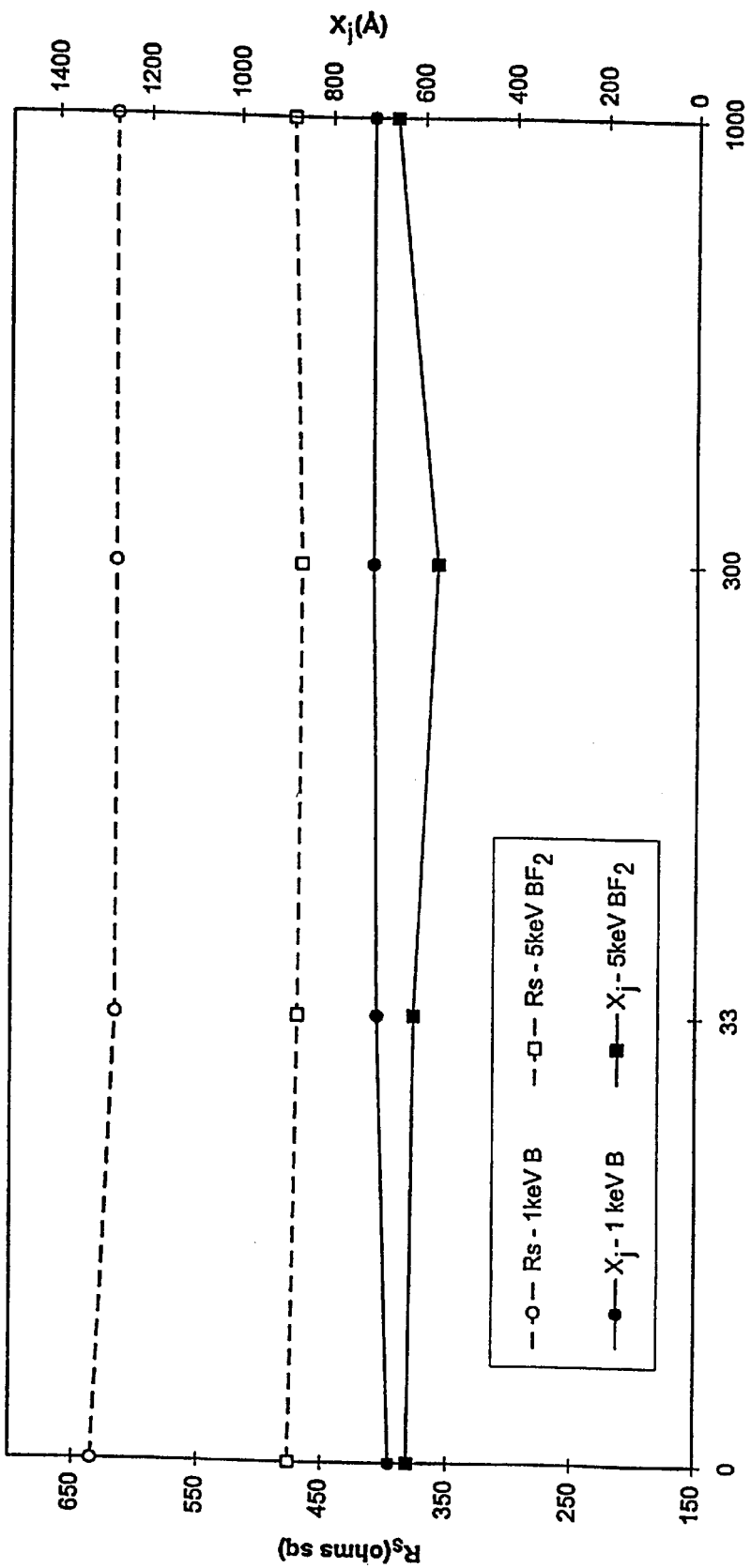
FIG. 9 is a graph of junction depth and sheet resistivity as a function of oxygen concentration for wafers implanted with 1 keV boron and 5 keV BF$_2$ and annealed at 950° C. for 10 seconds.

FIG. 9 is a graph of junction depth $X_j$ in angstroms and sheet resistivity $R_s$ in ohms per square as a function of oxygen concentration in parts per million for wafers implanted with 1 keV boron and 5 keV $BF_2$. The wafers were annealed at 950° C. for 10 seconds. It may be observed that the junction depth is less sensitive to oxygen concentration at lower annealing temperatures.

FIG. 9 further illustrates the temperature trend discussed above. Between 1000 parts per million and 0 parts per million oxygen, the effects are much smaller, but the sheet resistivity values are much higher, especially for boron implants. This indicates that to obtain low sheet resistivity and high electrical activation, temperatures in the range of 1000° C. to 1050° C. should be utilized.

Figure 10:
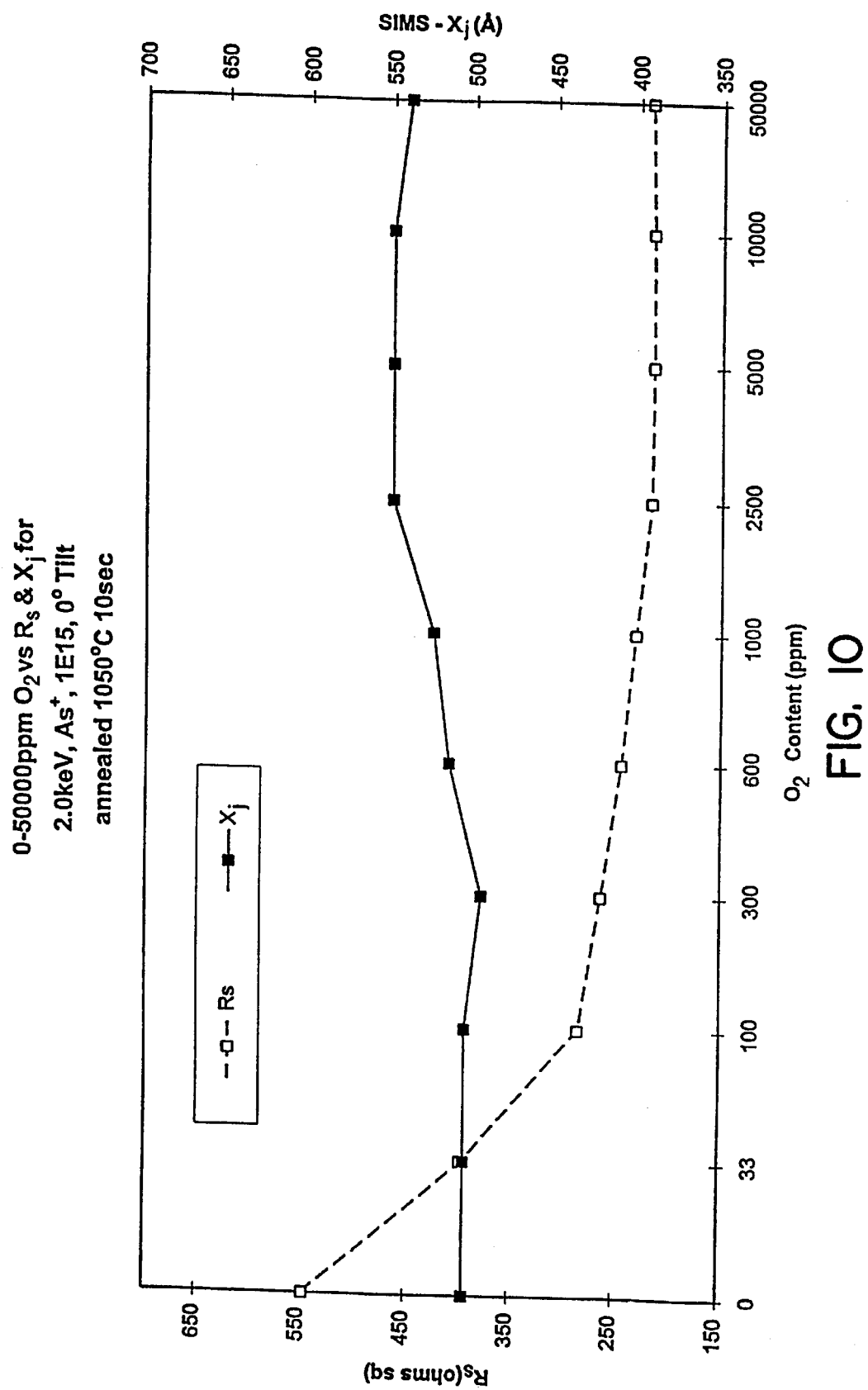
FIG. 10 is a graph of junction depth and sheet resistivity as a function of oxygen concentration for wafers implanted with 2.0 keV arsenic and annealed at 1050° C. for 10 seconds.

FIG. 10 is a graph of junction depth $X_j$ in angstroms sheet resistivity $R_s$ in ohms per square as a function of oxygen concentration in parts per million for wafers implanted with 2 keV arsenic at a dose of 1E15 ions/cm². The wafers were annealed at 1050° C. for 10 seconds.

As compared with boron and $BF_2$ arsenic shows similar but less dramatic effects with the reduction of oxygen concentration. The junction depth stops decreasing at about 300 parts per million oxygen. The sheet resistivity starts to increase at about 2500 parts per million oxygen. Depending upon the objective of the user, the optimum oxygen concentration level is between 300 parts per million and 2500 parts per million oxygen. Note that below 100 parts per million oxygen, the silicon etching and/or arsenic evaporation becomes severe, and the sheet resistivity increases dramatically.

Figure 11:
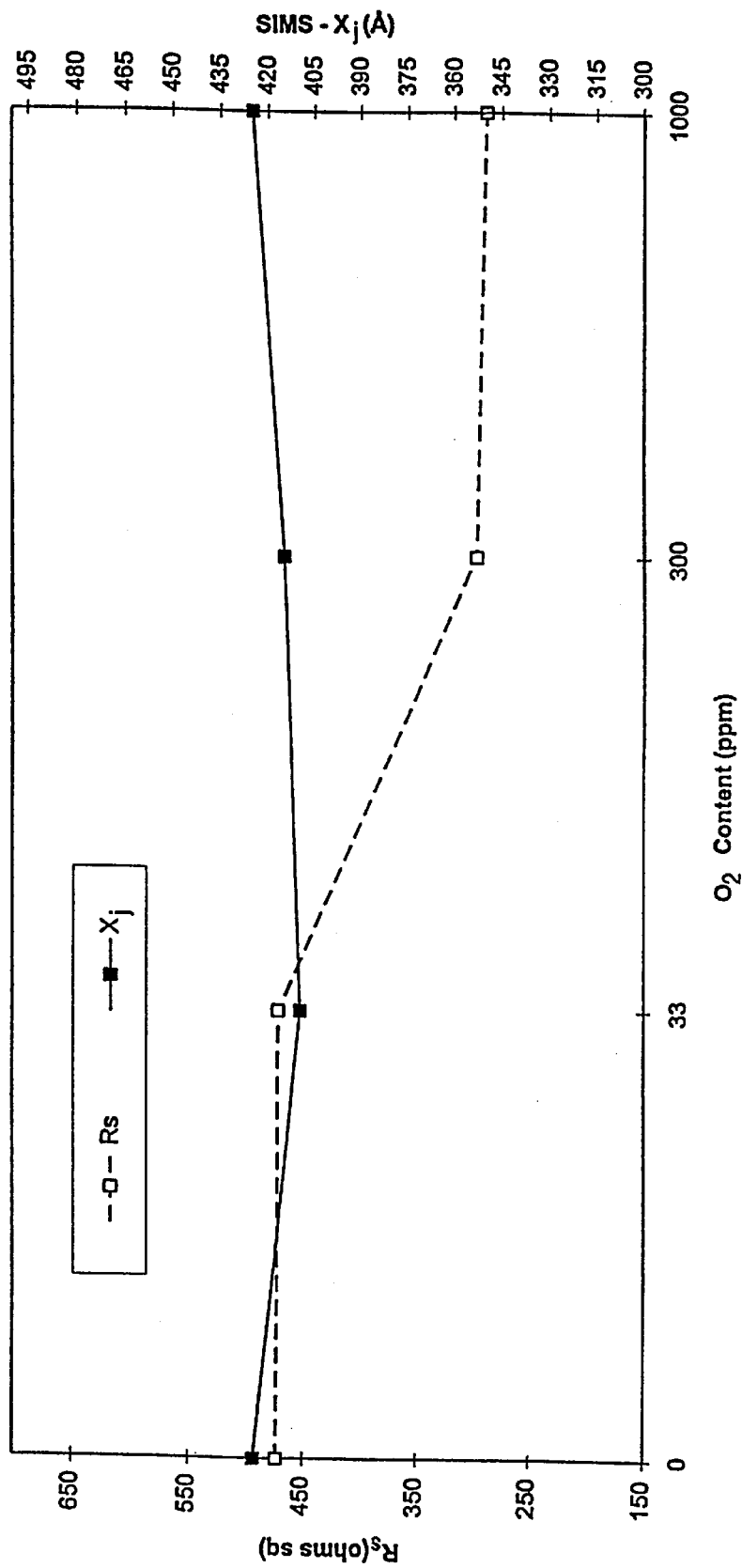
FIG. 11 is a graph of junction depth and sheet resistivity as a function of oxygen concentration for wafers implanted with 2.0 keV arsenic and annealed at 1000° C. for 10 seconds.

FIG. 11 is a graph of junction depth $X_j$ in angstroms and sheet resistivity $R_s$ in ohms per square as a function of oxygen concentration in parts per million for wafers implanted with 2.0 keV arsenic at a dose of 1E15 ions/cm². The wafers were annealed at 1000° C. for 10 seconds.

FIG. 11 shows the temperature dependency of arsenic implants at 1000° C. The junction depth decreases down to 33 parts per million oxygen, but the sheet resistivity starts to increase at 300 parts per million oxygen. This shows that the oxide grown for arsenic anneals is important at 1000° C., and 300 parts per million oxygen is needed to grow that oxide fast enough during the anneal to prevent evaporation of dopant material and/or silicon surface etching.

Figure 12:
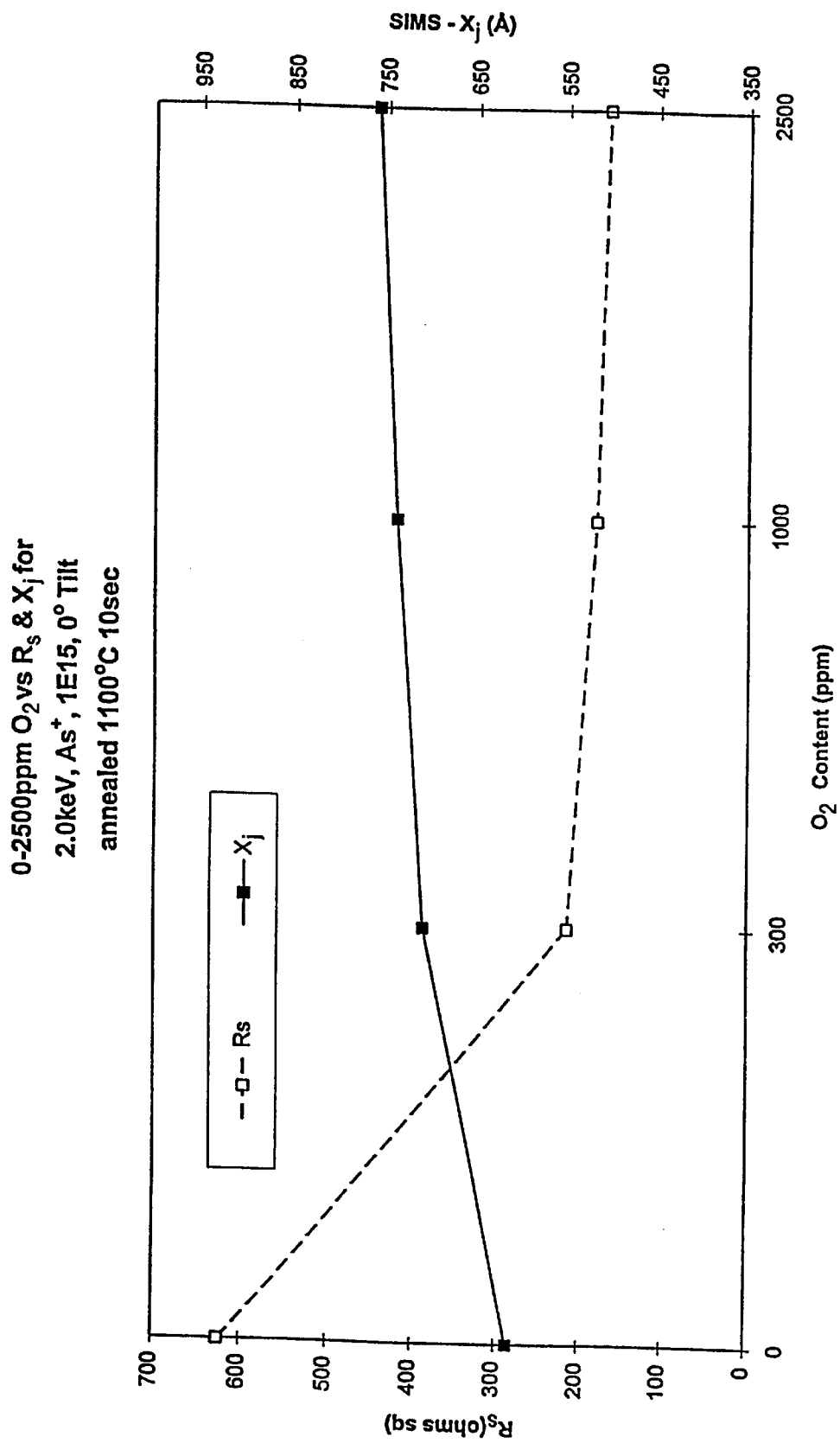
FIG. 12 is a graph of junction depth and sheet resistivity as a function of oxygen concentration for wafers implanted with 2.0 keV arsenic and annealed at 1100° C. for 10 seconds.

FIG. 12 is a graph of junction depth $X_j$ in angstroms and sheet resistivity $R_s$ in ohms per square as a function of oxygen concentration for wafers implanted with 2.0 keV arsenic at a dose of 1E15 ions/cm². The wafers were annealed at 1100° C. for 10 seconds.

FIG. 12 shows the temperature effect for arsenic implants at 1100° C. The junction depth continues to decrease down to 0 parts per million oxygen, but the sheet resistivity increases slowly from 2500 parts per million oxygen and increases dramatically from 300 parts per million oxygen.

Figure 13:
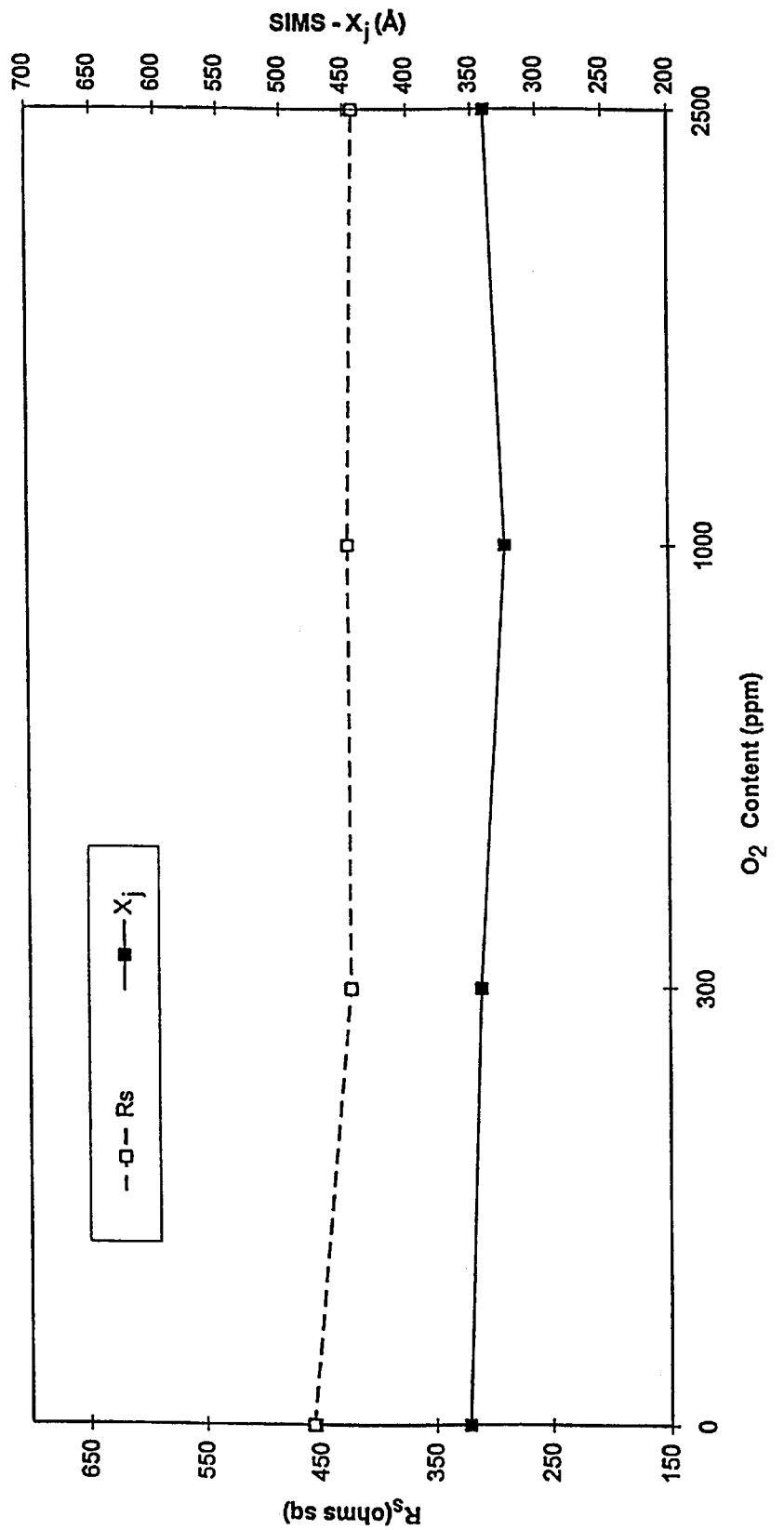
FIG. 13 is a graph of junction depth and sheet resistivity as a function of oxygen concentration for wafers implanted with 2.0 keV arsenic and annealed at 950° C. for 10 seconds.

FIG. 13 is a graph of junction depth $X_j$ in angstroms and sheet resistivity $R_s$ in ohms per square as a function of oxygen concentration in parts per million for wafers implanted with 2.0 keV arsenic at a dose of 1E15 ions/cm$^2$. The wafers were annealed at 950° C. for 10 seconds.

FIG. 13 shows the temperature effect on arsenic implants at 950° C. As in the case of boron and BF$_2$, the temperature effect is much smaller, but the sheet resistivity is much higher than at 1000° C. and 1050° C., indicating poor electrical activation. To achieve good electrical activation and lower sheet resistivity, arsenic is preferably annealed between 1000° C. and 1050° C.

In summary, the following observations may be made. Reducing and controlling oxygen concentration decreases junction depth for all species. The effect is most pronounced for boron and BF$_2$. The optimum oxygen concentration level, where sheet resistivity and junction depth are best, may be selected by the user and depends on temperature and time of anneal. The oxygen concentration level can range as low as 0 to 1 part per million up to 300 parts per million for boron and BF$_2$ and 2500 parts per million for arsenic. The compromise results from two competing phenomena. First, junction depth is a decreasing function of oxygen concentration because of OED, BED and/or TED (depending on species). Second, the oxygen provides a small oxide on the surface, which prevents or minimizes dopant loss, either through surface evaporation of dopant material and/or surface etching of silicon. The optimum oxygen concentration level also depends on whether the substrate, when annealed, had a native oxide or another capping layer, such as silicon dioxide, nitrided silicon or any other layer.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A method for forming a shallow junction in a semiconductor wafer, comprising the steps of:

implanting a dopant material into the semiconductor wafer;

activating said dopant material by thermal processing of the semiconductor wafer in a thermal processing chamber at a selected temperature for a selected time; and controlling oxygen concentration in the thermal processing chamber during the step of activating the dopant material at or near a selected level less than a background level that is typically present when the thermal processing chamber is filled with a process gas, wherein the step of controlling oxygen concentration includes the steps of reducing oxygen concentration in the thermal processing chamber to a level at or near zero and then introducing oxygen at or near the selected concentration level, wherein the step of implanting a dopant material includes implanting B$^+$ ions, BF$_2^+$ ions, As$^+$ ions, P$^+$ ions or other ions that can produce a junction depth of 1000 angstroms or less at an energy level of about 10 keV or less and wherein the step of controlling oxygen concentration includes controlling oxygen concentration at or near a selected level in a range less than 1000 parts per million.

2. A method for forming a shallow junction as defined in claim 1 wherein the step of controlling oxygen concentration includes controlling oxygen concentration at or near a selected level greater than one part per million.

3. A method for forming a shallow junction as defined in claim 1 wherein the step of controlling oxygen concentration includes controlling oxygen concentration at or near a selected level in a range of about 30–300 parts per million.

4. A method for forming a shallow junction as defined in claim 1 wherein the step of controlling oxygen concentration includes controlling oxygen concentration at or near a selected level in a range of about 30–40 parts per million.

5. A method for forming a shallow junction as defined in claim 1 wherein the step of reducing oxygen concentration comprises purging the thermal processing chamber with said process gas and wherein the step of introducing oxygen includes adjusting a mass flow controller coupled between an oxygen source and the thermal processing chamber.

6. A method for forming a shallow junction as defined in claim 1 wherein the step of reducing oxygen concentration includes vacuum pumping the thermal processing chamber.

7. A method for forming a shallow junction as defined in claim 1 wherein the step of introducing oxygen includes backfilling the thermal processing chamber with said process gas containing oxygen at or near the selected oxygen concentration level.

8. A method for forming a shallow junction as defined in claim 1 wherein said process gas comprises nitrogen.

9. A method for forming a shallow junction as defined in claim 1 wherein the selected temperature for activating said dopant material is in a range of about 950° C. to 1050° C. and wherein the selected time for activating said dopant material is about 30 seconds or less.

10. A method for forming a shallow junction as defined in claim 1 wherein the step of implanting a dopant material includes implanting B$^+$ ions at an energy level of about 2 keV or less and wherein the step of controlling oxygen concentration includes controlling oxygen concentration at or near a selected level in a range of about 30–300 parts per million.

* * * * *